(12) United States Patent
Kidoh et al.

(10) Patent No.: US 7,145,197 B2
(45) Date of Patent: Dec. 5, 2006

(54) SEMICONDUCTOR DEVICE AND METHOD OF MANUFACTURING THE SAME

(75) Inventors: Masaru Kidoh, Kawasaki (JP); Hideaki Aochi, Kawasaki (JP); Ryota Katsumata, Yokohama (JP); Masaru Kito, Yokohama (JP); Hitomi Yasutake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 26 days.

(21) Appl. No.: 11/117,337

(22) Filed: Apr. 29, 2005

(65) Prior Publication Data

US 2006/0189070 A1  Aug. 24, 2006

(30) Foreign Application Priority Data

Feb. 21, 2005 (JP) ............... 2005-044125

(51) Int. Cl.
*H01L 27/108* (2006.01)
(52) U.S. Cl. ............... 257/302; 257/296; 257/301; 257/532
(58) Field of Classification Search ............... 257/302, 257/301, 296, 532, 305
See application file for complete search history.

(56) References Cited

U.S. PATENT DOCUMENTS 6,063,658 A * 5/2000 Horak et al. ............... 438/248
6,074,909 A * 6/2000 Gruening ............... 438/242
6,255,683 B1 7/2001 Radens et al.
6,432,774 B1 8/2002 Heo et al.
6,436,836 B1 * 8/2002 Gobel ............... 438/700
6,734,484 B1 5/2004 Wu
2002/0076880 A1 * 6/2002 Yamada et al. ............... 438/243

FOREIGN PATENT DOCUMENTS

JP  2000-196045  7/2000

* cited by examiner

*Primary Examiner*—Michael Trinh
(74) *Attorney, Agent, or Firm*—Oblon, Spivak, McClelland, Maier & Neustadt, P.C.

(57) ABSTRACT

A semiconductor device includes a semiconductor substrate, a trench formed in the semiconductor substrate, an island-like element region formed in the semiconductor substrate, having an upper surface, first to third side surfaces, an upper portion, a middle portion and a lower portion, a gate insulating film formed on the first to third side surfaces in the upper portion of the element region, a gate electrode having first and second bottom surfaces, a first diffusion layer formed along the upper surface of the element region, a second diffusion layer formed along the first side surface in the middle portion of the element region, a channel region having first to third regions formed along the first to third side surfaces in the upper portion of the element region, a capacitor formed in the trench, and a bit line electrically connected to the first diffusion layer.

13 Claims, 9 Drawing Sheets

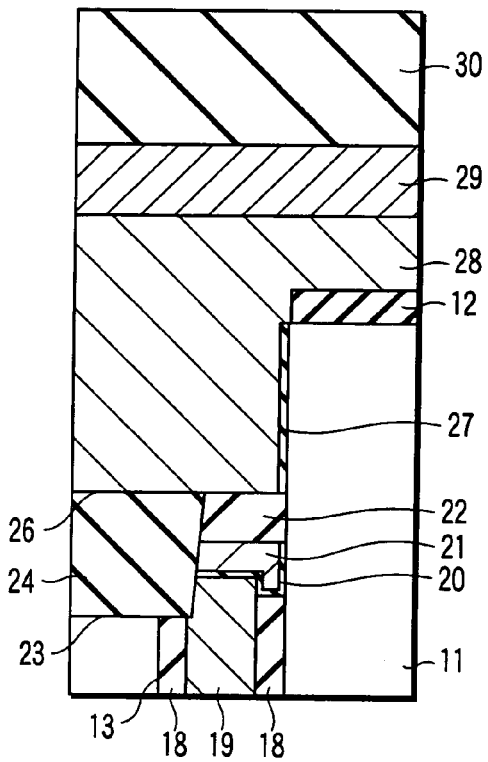
F I G. 11
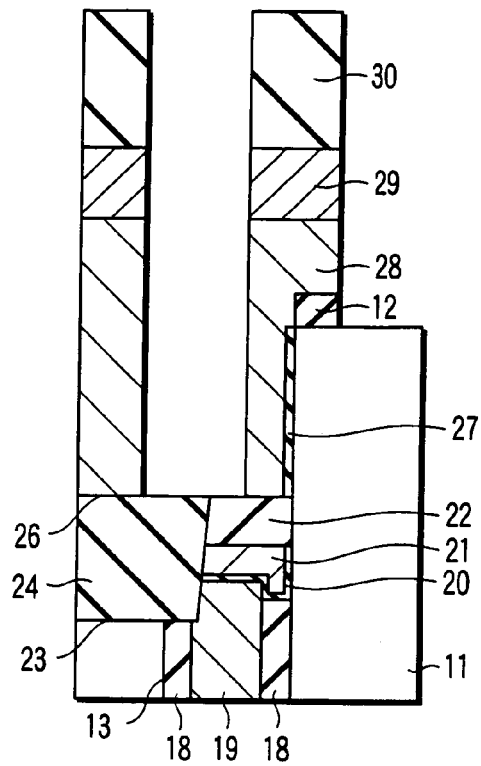
F I G. 13
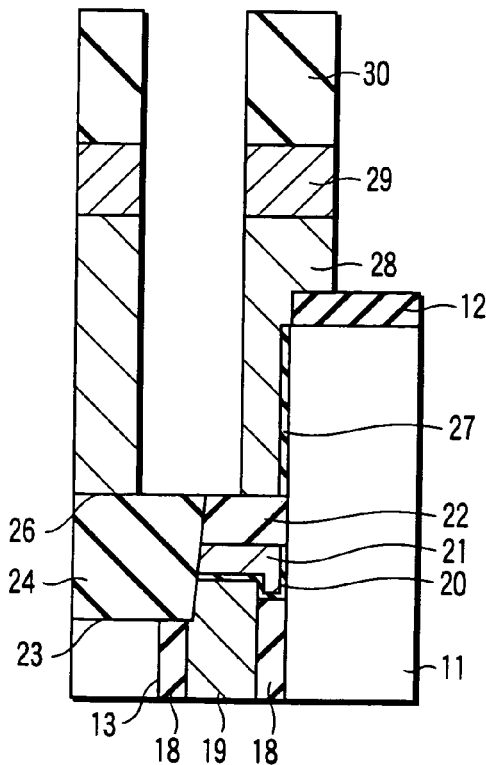
F I G. 12
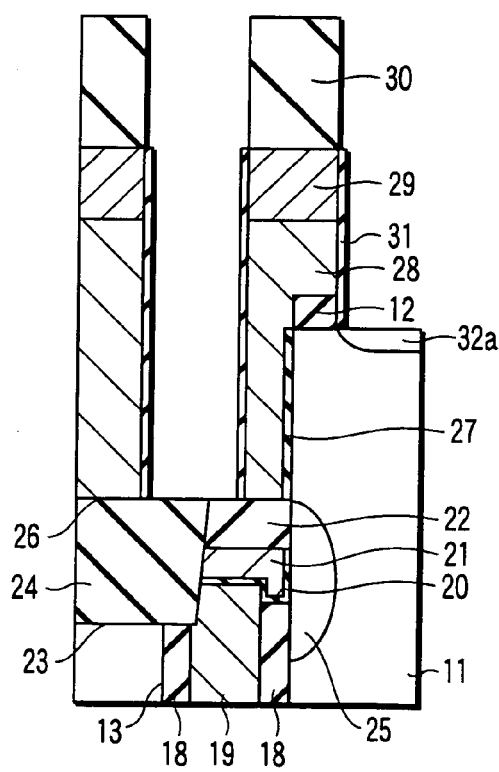
F I G. 14

SEMICONDUCTOR DEVICE AND METHOD OF MANUFACTURING THE SAME

CROSS-REFERENCE TO RELATED APPLICATIONS

This application is based upon and claims the benefit of priority from prior Japanese Patent Application No. 2005-044125, filed Feb. 21, 2005, the entire contents of which are incorporated herein by reference.

BACKGROUND OF THE INVENTION

1. Field of the Invention

The present invention relates to a semiconductor device having, e.g., a transistor and capacitor, and a method of manufacturing the same.

2. Description of the Related Art

With the recent advancing micropatterning of DRAMs (Dynamic Random Access Memories), a gate length L and gate width W of a cell transistor are decreasing, and this poses the problems of deterioration of the short-channel effect and the reduction of a driving electric current.

Also, as shown in FIG. 21, in a DRAM having a trench capacitor using a BS (Buried Strap), micro-patterning reduces the distance between a BS diffusion layer 125b and cell transistor 134. Therefore, misalignment between a capacitor 117 and gate electrode 128 allows the BS diffusion layer 125b to easily reach the channel region of the cell transistor 134. This deteriorates the short channel effect or causes punch through. Accordingly, very high alignment accuracy is required.

Note that prior art reference information related to the invention of this application is, e.g., "Jpn. Pat. Appln. KOKAI Publication No. 2000-196045".

BRIEF SUMMARY OF THE INVENTION

A semiconductor device according to a first aspect of the present invention comprises a semiconductor substrate, a trench formed in the semiconductor substrate, an island-like element region formed in the semiconductor substrate, having an upper surface, a first side surface exposed by the trench, a second side surface, and a third side surface opposing the second side surface, and having an upper portion including the upper surface, a middle portion positioned below the upper portion, and a lower portion positioned below the middle portion, a gate insulating film formed on the first to third side surfaces in the upper portion of the element region, a gate electrode having a portion extending over the upper surface of the element region and the second and third side surfaces in the upper portion of the element region, and having a first bottom surface positioned above the upper surface of the element region, and a second bottom surface positioned below the upper surface of the element region, a first diffusion layer formed along the upper surface of the element region, a second diffusion layer formed along the first side surface in the middle portion of the element region, a channel region having a first region formed along the first side surface in the upper portion of the element region, a second region formed along the second side surface in the upper portion of the element region, and a third region formed along the third side surface in the upper portion of the element region, a capacitor formed in the trench and adjacent to the lower portion of the element region, and a bit line electrically connected to the first diffusion layer.

A method of manufacturing a semiconductor device according to a second aspect of the present invention comprises forming a trench having an upper portion, middle portion, and lower portion in a semiconductor substrate, forming a capacitor in the lower portion of the trench, forming, in the middle portion of the trench, a connecting portion which connects to the capacitor, forming an insulating film in the upper portion of the trench, selectively removing the insulating film to form a groove, forming a gate insulating film on a side surface of the groove, forming a gate electrode having a first bottom surface positioned above an upper surface of the semiconductor substrate, and a second bottom surface positioned below the upper surface of the semiconductor substrate, forming a first diffusion layer on the upper surface of the semiconductor substrate, and a second diffusion layer along an outer side surface of the middle portion of the trench, and forming a bit line which electrically connects to the first diffusion layer.

BRIEF DESCRIPTION OF THE SEVERAL VIEWS OF THE DRAWING

FIGS. 3 to 17 are sectional views showing the manufacturing steps of the semiconductor device according to the first embodiment of the present invention;

DETAILED DESCRIPTION OF THE INVENTION

Figure 1:
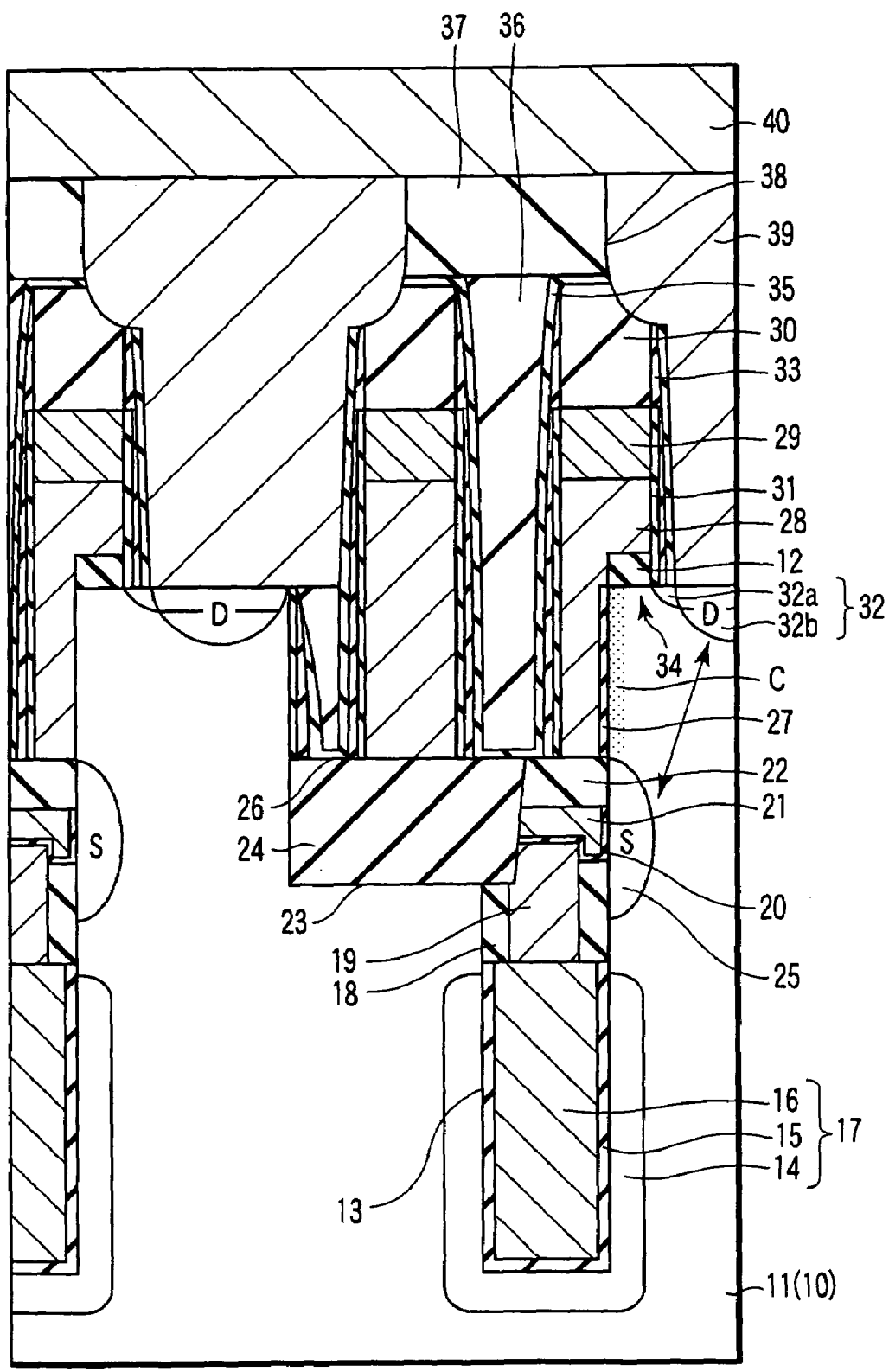
FIG. 1 is a sectional view showing a semiconductor device according to the first embodiment of the present invention.

Embodiments of the present invention will be described below with reference to the accompanying drawing. In the following explanation, the same reference numerals denote the same parts throughout the drawing.

First Embodiment

A semiconductor device according to the first embodiment is an example of a DRAM (Dynamic Random Access Memory) including a cell transistor having a vertical triple gate and a trench capacitor using a BS (Buried Strap).

FIG. 1 is a sectional view of the semiconductor device according to the first embodiment of the present invention. This semiconductor device according to the first embodiment will be explained below.

As shown in FIG. 1, the semiconductor device according to the first embodiment includes a deep trench (DT) 13 formed in a semiconductor substrate 11, a trench capacitor 17 formed in the deep trench 13, a cell transistor 34 having a gate electrode 28 and source and drain diffusion layers 25 and 32, and a bit line 40. More specifically, the structure is as follows.

The trench capacitor 17 is formed in the lower portion of the deep trench 13. The trench capacitor 17 includes a lower electrode 14 made of a diffusion layer, a capacitor insulating film 15, and an upper electrode 16 serving as a storage node. The lower electrode 14 is formed in the semiconductor substrate 11 along the outer side surfaces and outer bottom surface of the deep trench 13. The capacitor insulating film 15 is formed on the inner side surfaces of the deep trench 13. The upper electrode 16 is formed on the capacitor insulating film 15 in the deep trench 13.

In the middle portion of the deep trench 13, first and second connecting portions 19 and 21 which connect the trench capacitor 17 and cell transistor 34 and the like are present. A collar oxide film 18 is formed on the inner side surfaces of the deep trench 13. The first connecting portion 19 which connects to the upper electrode 16 is formed on it. An interface layer 20 is continuously formed on the collar oxide film 18, on the first connecting portion 19, and on the inner side surfaces of the deep trench 13. The second connecting portion 21 is formed on the interface layer 20. An insulating film 22 is formed on the second connecting portion 21.

In the vicinity of the middle portion of the deep trench 13, an element isolation trench 23 is formed by partially removing the semiconductor substrate 11, first and second connecting portions 19 and 21, collar oxide film 18, interface layer 20, and insulating film 22. In the element isolation trench 23, an element isolation insulating film 24 having an STI (Shallow Trench Isolation) structure is formed. The upper surface of the element isolation insulating film 24 is substantially leveled with the upper surface of the insulating film 22. The bottom surface of the element isolation insulating film 24 is desirably positioned below the upper surface of the collar oxide film 18.

In the upper portion of the deep trench 13, a groove 26 shallower than the deep trench 13 and having an opening larger than that of the deep trench 13 is formed. The upper surface of the groove 26 is substantially leveled with the upper surface of the semiconductor substrate 11. The bottom surface of the groove 26 is substantially leveled with the upper surfaces of the element isolating insulting film 24 and insulating film 22. Accordingly, the upper surface of the element isolation insulating film 24 is positioned below the upper surface of the semiconductor substrate 11.

The gate electrode 28 of the cell transistor 34 is formed in the boundary between the semiconductor substrate 11 and groove 26. The gate electrode 28 has first and second bottom surfaces. The first bottom surface of the gate electrode 28 is positioned above the upper surface of the semiconductor substrate 11, and in contact with, e.g., the upper surface of a pad 12. The second bottom surface of the gate electrode 28 is positioned below the upper surface of the semiconductor substrate 11, in contact with, e.g., the bottom surface of the groove 26 (the upper surface of the insulating film 22), and substantially leveled with, e.g., the upper surface of the element isolation insulating film 24. Details of the gate electrode 28 will be described later.

In the semiconductor substrate 11, the source diffusion layer 25 of the cell transistor 34 is formed along the outer side surfaces of the middle portion of the deep trench 13. The source diffusion layer 25 is formed near the second connecting portion 21, and separated from the lower electrode 14 of the trench capacitor 17. On the surface of the semiconductor substrate 11, the drain diffusion layer 32 of the cell transistor 34 is formed. The drain diffusion layer 32 includes a low-concentration diffusion layer 32a and a high-concentration diffusion layer 32b formed contiguously with the low-concentration diffusion layer 32a, and has an LDD (Lightly Doped Drain) structure.

A gate insulating film 27 is formed between the gate electrode 28 and the side surface of the semiconductor substrate 11. The pad 12 is present between the gate electrode 28 and the upper surface of the semiconductor substrate 11. A tungsten silicide film 29 is formed on the gate electrode 28, and a silicon nitride film 30 is formed on the tungsten silicide film 29. A first sidewall layer 31 is formed on the side surfaces of the gate electrode 28 and tungsten silicide film 29. A second sidewall layer 33 is formed on the side surfaces of the first sidewall layer 31 and silicon nitride film 30. A silicon nitride film 35 is formed on the second sidewall layer 33 and silicon nitride film 30. A silicon oxide film 36 is buried around the silicon nitride film 35. A bit line contact 39 is connected to the drain diffusion layer 32, and the bit line 40 is connected to the bit line contact 39.

In the semiconductor device according to the first embodiment as described above, the source diffusion layer 25 of the cell transistor 34 is connected to the upper electrode 16 of the trench capacitor 10 via the interface layer 20 and first and second connecting portions 19 and 21, and the drain diffusion layer 32 of the cell transistor 34 is connected to the bit line 40 via the bit line contact 39, thereby forming a DRAM. Note that the interface layer 20 is a very thin layer and has almost no electrical insulating properties. Accordingly, no electrical connection problem arises between the source diffusion layer 25 and upper electrode 16.

Figure 2A:
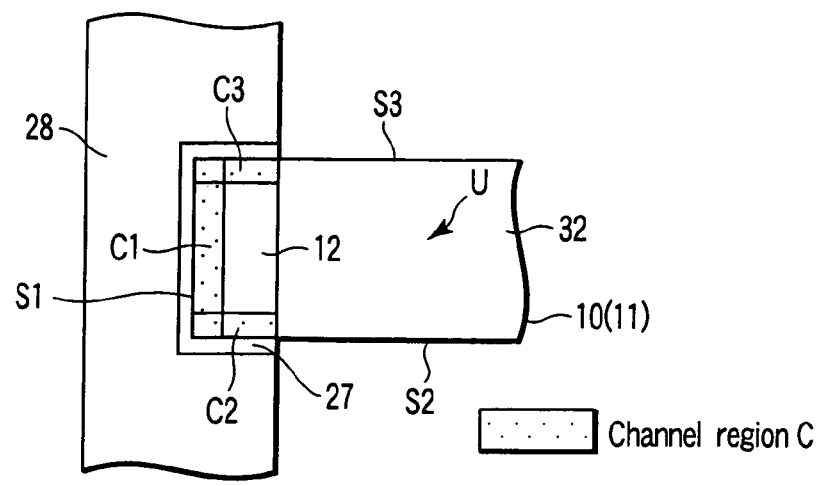
FIG. 2A is a schematic plan view showing the semiconductor device according to the first embodiment of the present invention.
Figure 2B:
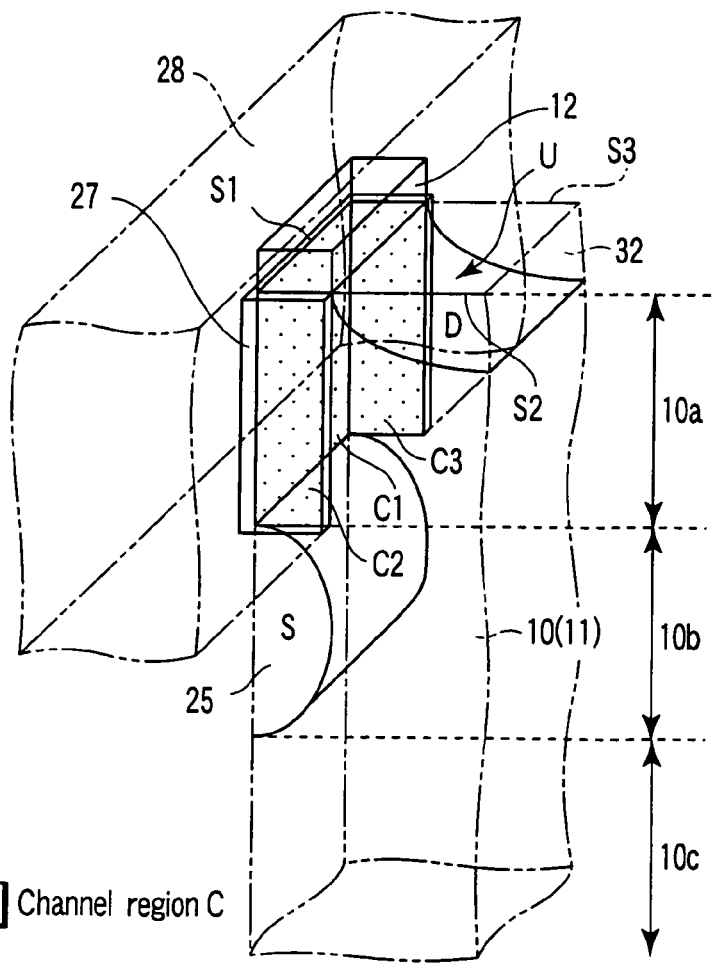
FIG. 2B is a schematic perspective view showing the semiconductor device according to the first embodiment of the present invention.

FIGS. 2A and 2B are schematic plan and perspective views, respectively, of the semiconductor device according to the first embodiment of the present invention. The structure of the gate electrode and its vicinity according to the first embodiment will be explained below.

As shown in FIG. 2A, the semiconductor substrate 11 has an island-like element region 10. The element region 10 has an upper surface U, a first side surface S1 exposed by the trench 24 (deep trench 13), a second side surface S2, and a third side surface S3 opposing the second side surface S2.

As shown in FIG. 2B, the element region 10 has an upper portion 10a including the upper surface U, a middle portion 10b positioned below the upper portion 10a, and a lower portion 10c positioned below the middle portion 10b.

The gate insulating film 27 is continuously formed on the first, second, and third side surfaces S1, S2, and S3 in the upper portion 10a of the element region 10. The pad 12 is formed on a portion of the upper surface U of the element region 10.

A portion of the gate electrode 28 extends across the end portion of the element region 10 along the upper surface U of the element region 10 and the second and third side surfaces S2 and S3 in the upper portion 10a of the element region 10. In addition, the gate electrode 28 is in contact with the gate insulating film 27. That is, the gate electrode 28 is partially excavated by the upper portion 10a of the island-like element region 10.

The gate electrode 28 has a triple gate structure in which a channel region C is made up of three regions C1, C2, and C3. The first region C1 is formed along the first side surface S1 in the upper portion 10a of the element region 10. The second region C2 is formed along the second side surface S2 in the upper portion 10a of the element region 10. The third region C3 is formed along the third side surface S3 in the upper portion 10a of the element region 10.

Note that the trench capacitor 17 (not shown) is formed in the deep trench 13, and adjacent to the lower portion 10c of the element region 10.

FIGS. 3 to 17 are sectional views of the manufacturing steps of the semiconductor device according to the first embodiment of the present invention. A method of manufacturing the semiconductor device according to the first embodiment will be described below. In this explanation, the manufacturing method of a portion of the semiconductor device shown in FIG. 1 will be described.

Figure 3:
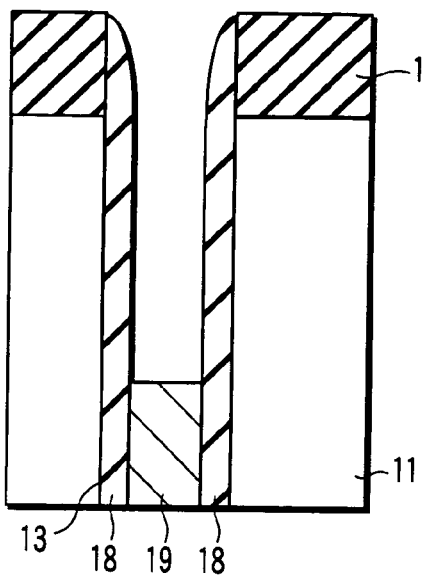

First, as shown in FIG. 3, a pad 12 made of, e.g., a silicon nitride film is formed on a semiconductor substrate (e.g., a silicon substrate) 11. Then, the pad 12 and semiconductor substrate 11 are selectively etched by anisotropic etching such as RIE (Reactive Ion Etching) to form a deep trench 13. A capacitor (not shown) is formed in the deep trench 13. A collar oxide film 18 is formed in the deep trench 13. A first connecting portion 19 made of, e.g., polysilicon is formed on the collar oxide film 18. After that, the first connecting portion 19 is partially removed. This makes the position of the upper surface of the first connecting portion 19 much lower than the upper surface of the semiconductor substrate 11.

Figure 4:
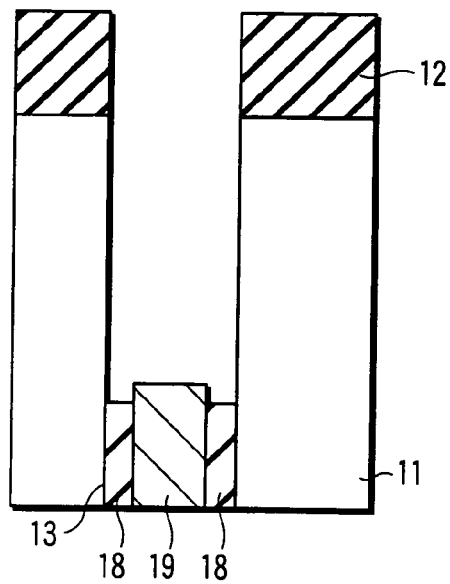

As shown in FIG. 4, the collar oxide film 18 is partially removed by isotropic etching such as wet etching until the upper surface of the collar oxide film 18 becomes lower than the upper surface of the first connecting portion 19.

Figure 5:
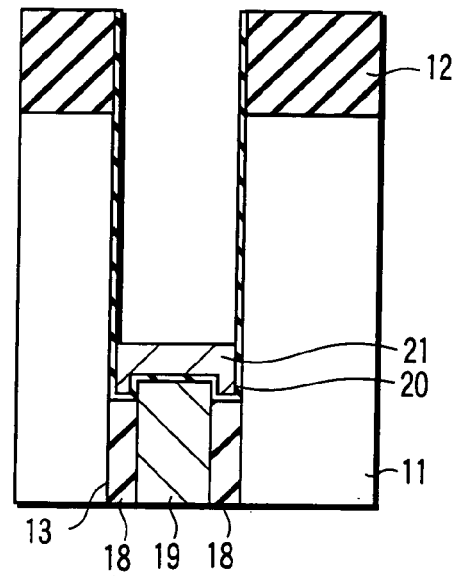

As shown in FIG. 5, an interface layer 20 made of, e.g., a silicon nitride film or silicon oxide film is formed in the deep trench 13, and a second connecting portion 21 made of, e.g., polysilicon is formed on the interface layer 20. After that, the second connecting portion 21 is partially removed by isotropic etching such as wet etching until the upper surface of the second connecting portion 21 becomes lower than the upper surface of the semiconductor substrate 11.

Figure 6:
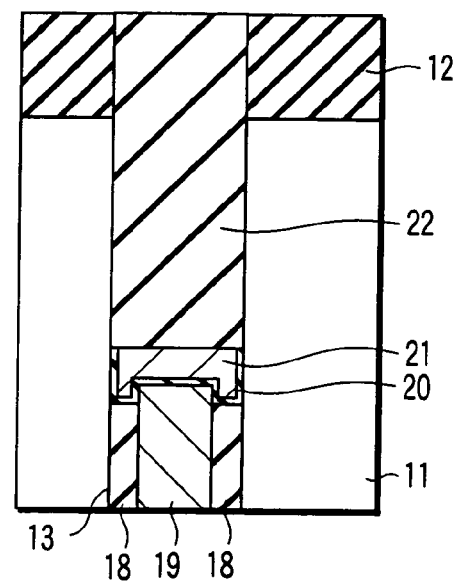

As shown in FIG. 6, an insulating film 22 is formed in the deep trench 13, and the upper surface of the insulating film 22 is planarized by CMP (Chemical Mechanical Polish) or the like until the pad 12 is exposed. The insulating film 22 is desirably made of a material which is easy to bury, and a silicon oxide film is an example.

Figure 7:
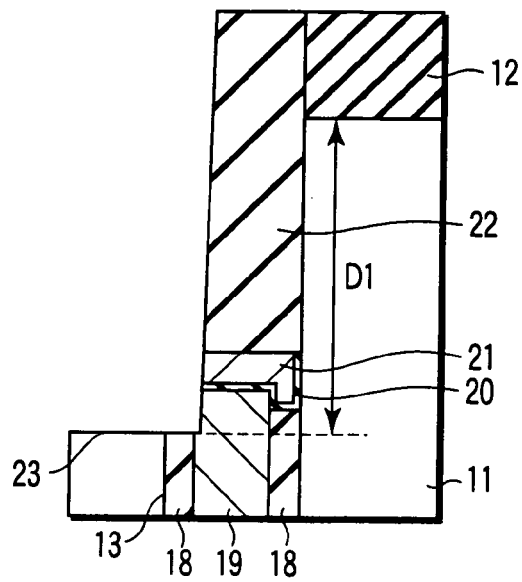

As shown in FIG. 7, an element isolation trench 23 is formed by anisotropic etching such as RIE. This etching is desirably so performed that the bottom surface of the element isolation trench 23 is positioned below the upper surface of the collar oxide film 18. A depth D1 from the upper surface of the semiconductor substrate 11 to the bottom surface of the element isolation trench 23 is, e.g., about 250 to 300 nm.

Figure 8:
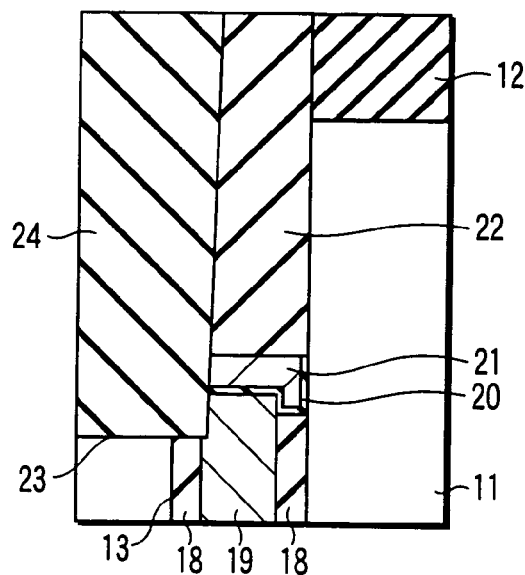

As shown in FIG. 8, an element isolation insulating film 24 made of, e.g., a silicon oxide film is buried in the element isolation trench 23. The upper surface of the element isolation insulating film 24 is planarized by CMP or the like.

Figure 9:
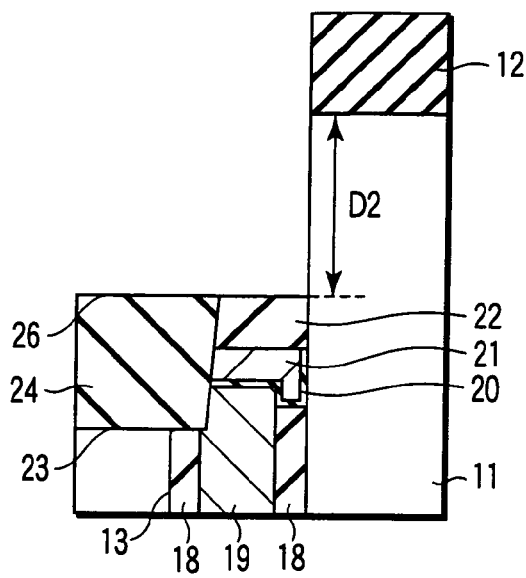

As shown in FIG. 9, the element isolation insulating film 24 and insulating film 22 are partially removed by isotropic etching such as wet etching, until the upper surfaces of the element isolating insulating film 24 and insulating film 22 become lower than the upper surface of the semiconductor substrate 11. In this manner, a groove 26 is formed. A depth D2 from the upper surface of the semiconductor substrate 11 to the bottom surface of the groove 26 is, e.g., about 200 nm. Note that the insulating film 22 and element isolation insulating film 24 desirably remain below the bottom surface of the groove 26, in order to prevent a shortcircuit between a gate electrode 28 and capacitor (to be described later), and suppress the influence on the DRAM characteristics.

Figure 10:
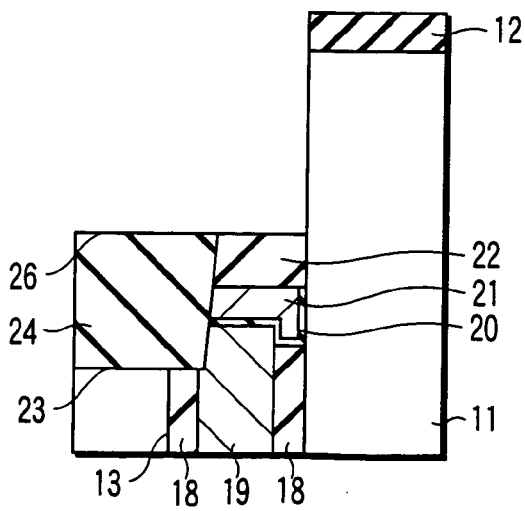

As shown in FIG. 10, the pad 12 is thinned as it is partially removed by isotropic etching such as wet etching, in order to facilitate removal of the pad 12 in a subsequent step (FIG. 13).

As shown in FIG. 11, after a well region (not shown) and channel region (not shown) are formed, a gate insulating film 27 is formed on the side surface of the semiconductor substrate 11. Then, a gate electrode 28 made of, e.g., polysilicon is formed in the groove 26 and on the pad 12. A tungsten silicide film 29 is formed on the gate electrode 28, and a silicon nitride film 30 is formed on the tungsten silicide film 29.

As shown in FIG. 12, the gate electrode 28, tungsten silicide film 29, and silicon nitride film 30 are processed into a predetermined pattern by anisotropic etching such as RIE.

As shown in FIG. 13, the pad 12 exposed from the gate electrode 28 and the like is removed by anisotropic etching such as RIE, thereby exposing the upper surface of the semiconductor substrate 11.

As shown in FIG. 14, a first sidewall layer 31 made of, e.g., a silicon oxide film is formed on the side surfaces of the gate electrode 28 and tungsten silicide film 29 by, e.g., thermal oxidation. Then, a low-concentration diffusion layer 32a is formed on the surface of the semiconductor substrate 11 by ion implantation and annealing. Furthermore, a source diffusion layer 25 is formed on the outer side surface of the deep trench 13 near the second connecting portion 21 by a series of heating steps. In the source diffusion layer 25, diffusion in the lateral direction is suppressed by the interface layer 20. This prevents a shortcircuit to the adjacent source diffusion layer 25.

Figure 15:
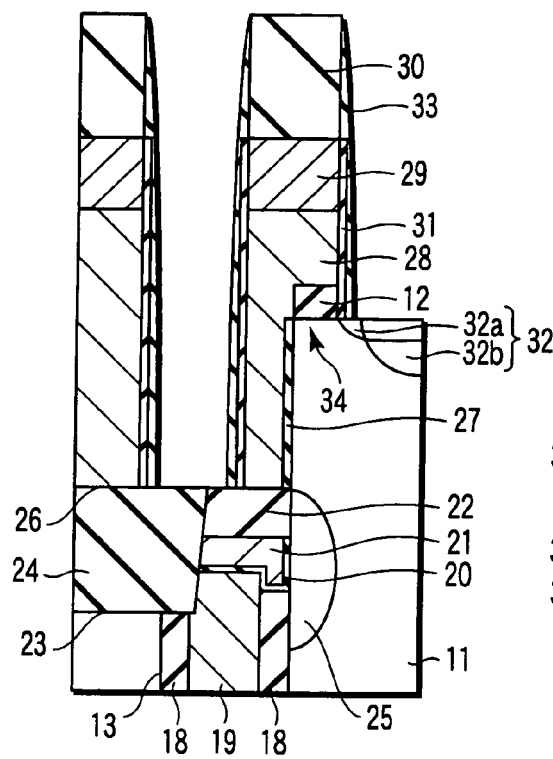

As shown in FIG. 15, a second sidewall layer 33 made of, e.g., silicon nitride film is formed on the side surfaces of the first sidewall layer 31 and silicon nitride film 30. After that, a high-concentration diffusion layer 32b is formed on the surface of the semiconductor substrate 11 by ion implantation and annealing, thereby forming a drain diffusion layer 32 having the LDD structure. In this manner, a cell transistor 34 is formed.

Figure 16:
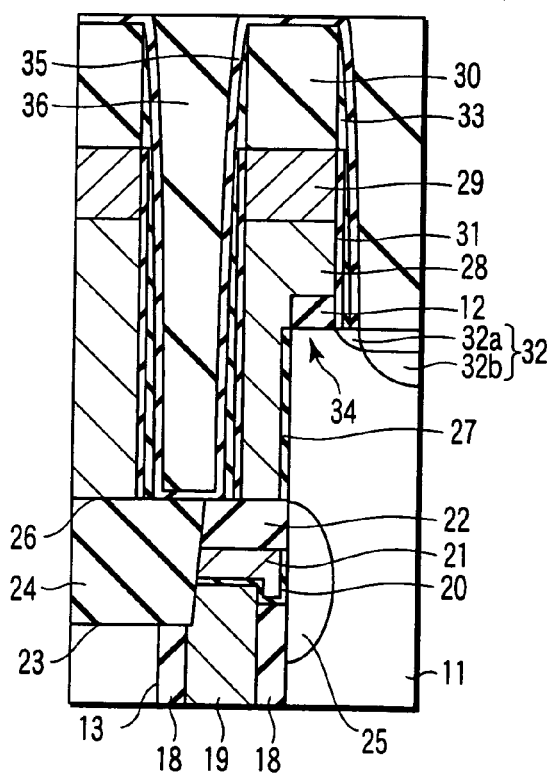

Then, as shown in FIG. 16, a silicon nitride film 35 is formed on the transistor 34, and a silicon oxide film 36 is formed on the silicon nitride film 35. After that, the upper surface of the silicon oxide film 36 is planarized by CMP to expose the silicon nitride film 35.

Figure 17:
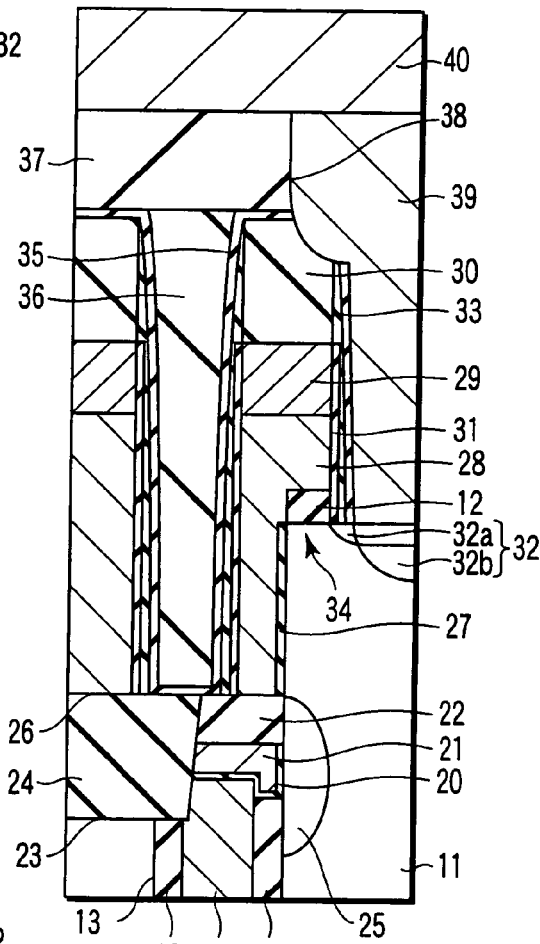

As shown in FIG. 17, a TEOS (Tetra Ethyl Ortho Silicate) film 37 is formed on the silicon nitride film 35 and silicon oxide film 36. A contact hole 38 is then formed by anisotropic etching such as RIE, and a bit line contact 39 made of, e.g., polysilicon or tungsten is formed in the contact hole 38. After that, a bit line 40 connecting to the bit line contact 39 is formed.

Note that in the step shown in FIG. 14, the first sidewall layer 31 may also be formed not only on the side surfaces of the gate electrode 28 and tungsten silicide film 29, but also on the side surfaces of the silicon nitride film 30 by changing the conditions. Note also that it is also possible to entirely remove the pad 12 in the step shown in FIG. 10, and omit the step shown in FIG. 13.

In the first embodiment described above, the gate electrode 28 of the cell transistor 34 is formed in the vertical direction (the direction of depth of the substrate 11) by using the three side surfaces S1, S2, and S3 of the island-like element region 10. Accordingly, a long gate length L of the gate electrode 28 can be ensured in the vertical direction, and the channel regions C1, C2, and C3 can be formed by the three side surfaces S1, S2, and S3, respectively. That is, a long distance can be assured between the source diffusion layer 25 and drain diffusion layer 32. Even when micropatterning of the semiconductor device advances, therefore, it is possible to increase the driving current of the transistor 34, and improve punch through by suppressing the short channel effect.

Note that FIG. 14 of Jpn. Pat. Appln. KOKAI Publication No. 2000-196045 mentioned earlier discloses a vertical gate electrode 30. However, according to the manufacturing method described in Jpn. Pat. Appln. KOKAI Publication No. 2000-196045, a channel region of the gate electrode 30 presumably has one side surface. That is, the channel region in Jpn. Pat. Appln. KOKAI Publication No. 2000-196045 has only a region corresponding to the first region C1 of the channel region according to the first embodiment of the present invention, and does not have any regions corresponding to the second and third regions C2 and C3 of the channel region according to the first embodiment of the present invention. Accordingly, Jpn. Pat. Appln. KOKAI Publication No. 2000-196045 entirely differs from the first embodiment in which the three channel regions C1, C2, and C3 are formed by using the three side surfaces S1, S2, and S3, respectively, of the element region 10.

Second Embodiment

In the second embodiment, examples of cell layouts of a semiconductor device will be described.

Figure 18:
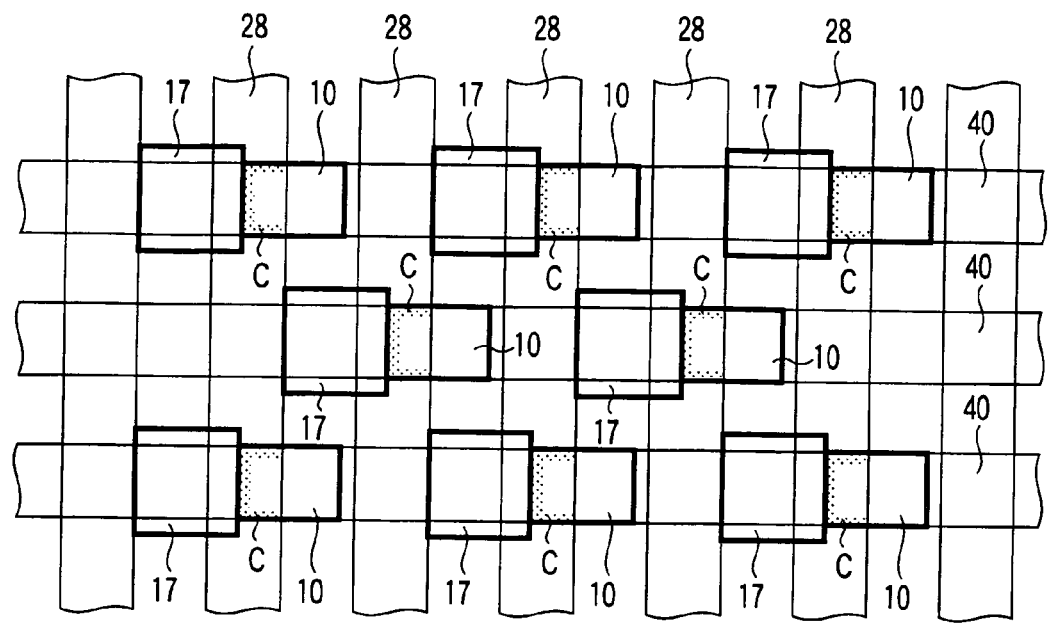
FIG. 18 is a plan view showing a first layout of a semiconductor device according to the second embodiment of the present invention.
Figure 19:
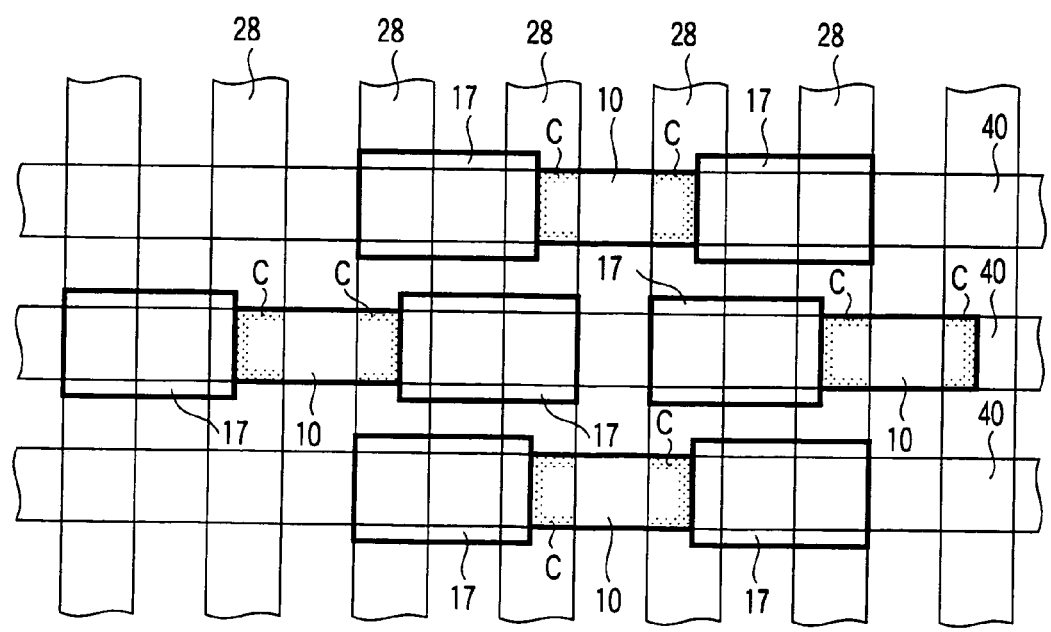
FIG. 19 is a plan view showing a second layout of the semiconductor device according to the second embodiment of the present invention.
Figure 20:
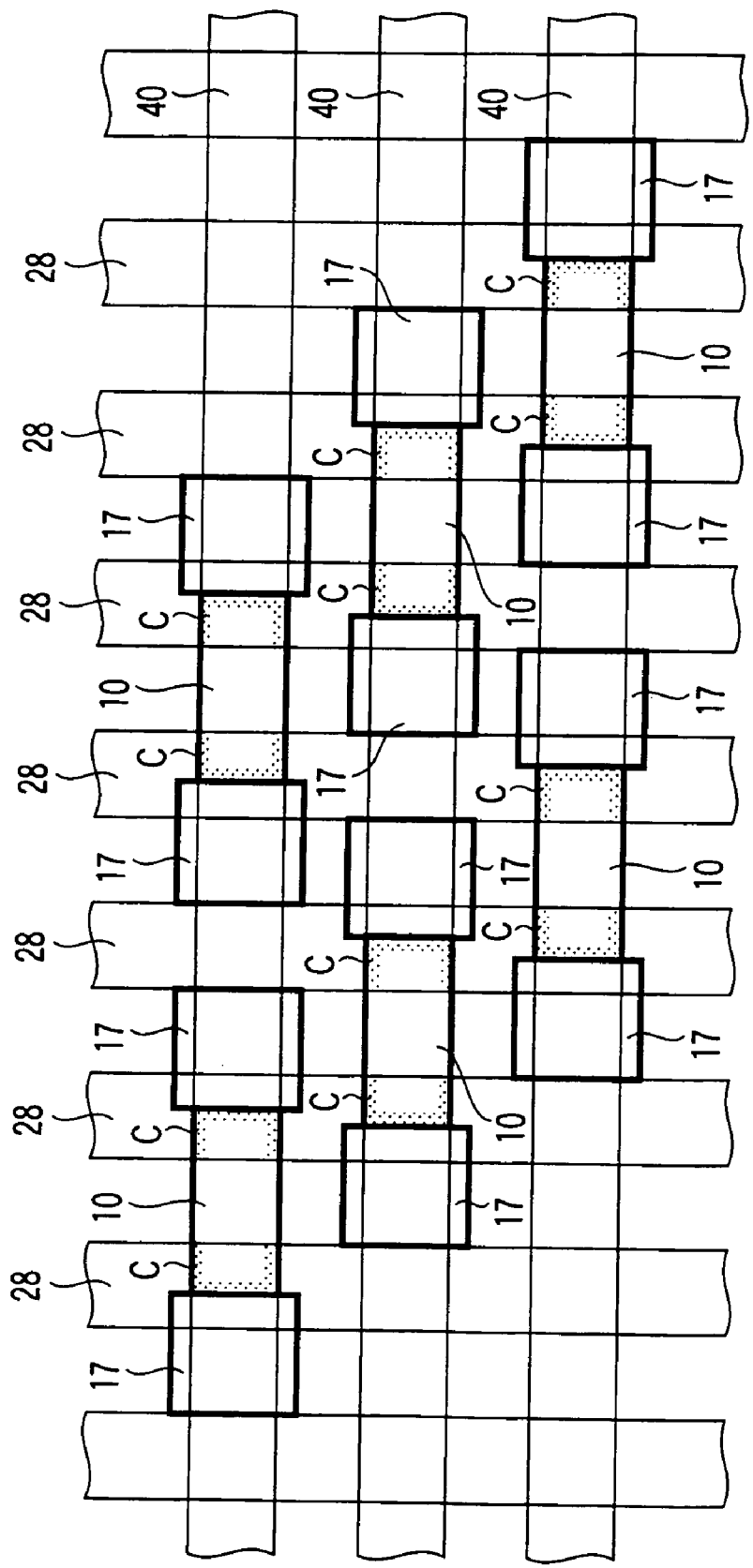
FIG. 20 is a plan view showing a third layout of the semiconductor device according to the second embodiment of the present invention.
Figure 21:
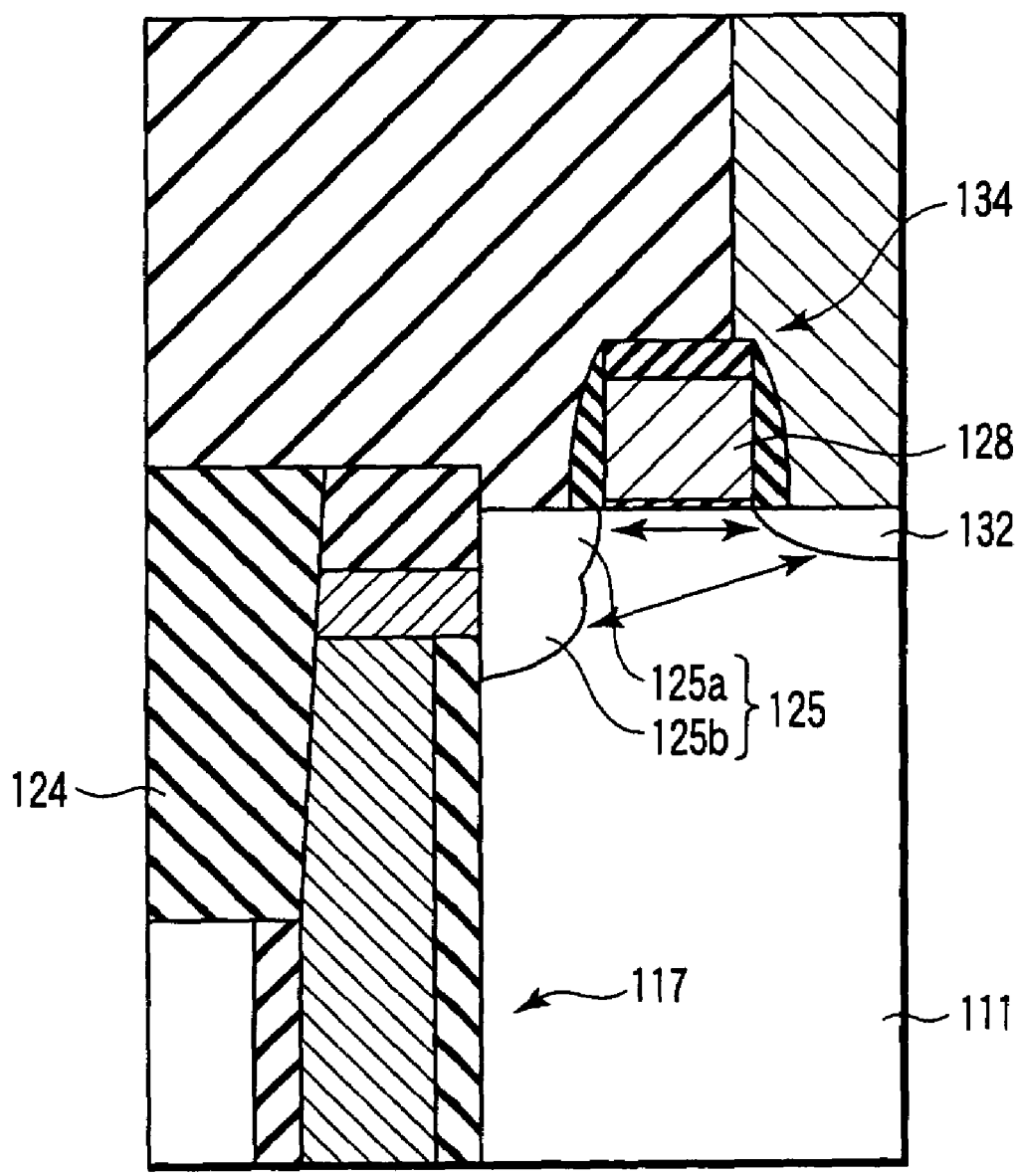
FIG. 21 is a sectional view showing a semiconductor device according to prior art.

FIGS. 18 to 20 are plan views of first to third layouts of a semiconductor device according to the second embodiment of the present invention. The first to third layouts of the semiconductor device according to the second embodiment will be explained below. Note that the first to third layers are applicable to the semiconductor device according to the first embodiment.

(First Layout)

The first layout is an example of the 8F2 cell type.

As shown in FIG. 18, a plurality of island-like element regions 10 are present, and a capacitor 17 is formed adjacent to one end of each element region 10. A plurality of gate electrodes 28 extend in the longitudinal direction of the paper across the element regions 10. A plurality of bit lines 40 extend over the element regions 10 in the lateral direction of the paper.

In the lateral direction, the element regions 10 are arranged below one bit line 40 for every other gate electrode 28. In the longitudinal direction, the element regions 10 are arranged below one gate electrode 28 for every other bit line 40.

In addition, near the boundary between the element region 10 and capacitor 17, a U-shaped channel region C is present in the element region 10. As explained in the first embodiment, the channel region C is formed on the three side surfaces of the element region 10.

(Second Layout)

The second layout is another example of the 8F2 cell type.

As shown in FIG. 19, the second layout differs from the first layout in that capacitors 17 are formed at the two ends of each element region 10, and the lateral dimension of the capacitor 17 is large. Also, groups each made up of one element region 10 and two capacitors 17 are repetitively arranged in the lateral direction. In addition, in the longitudinal direction, these groups are shifted from each other by two gate electrodes 28.

(Third Layout)

The third layout is an example of the 6F2 cell type.

As shown in FIG. 20, the third layout differs from the first layout in that capacitors 17 are formed at the two ends of each element region 10. Also, groups each made up of one element region 10 and two capacitors 17 are repetitively arranged in the lateral direction. In addition, in the longitudinal direction, these groups are shifted from each other by one gate electrode 28.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a semiconductor substrate;
    a trench formed in the semiconductor substrate;
    an island-like element region formed in the semiconductor substrate, having an upper surface, a first side surface exposed by the trench, a second side surface, and a third side surface opposing the second side surface, and having an upper portion including the upper surface, a middle portion positioned below the upper portion, and a lower portion positioned below the middle portion;
    a gate insulating film formed on the first to third side surfaces in the upper portion of the element region;
    a gate electrode having a portion extending over the upper surface of the element region and the second and third side surfaces in the upper portion of the element region, and having a first bottom surface positioned above the upper surface of the element region, and a second bottom surface positioned below the upper surface of the element region;
    a first diffusion layer formed along the upper surface of the element region;
    a second diffusion layer formed along the first side surface in the middle portion of the element region;
    a channel region having a first region formed along the first side surface in the upper portion of the element region, a second region formed along the second side surface in the upper portion of the element region, and a third region formed along the third side surface in the upper portion of the element region;
    a capacitor formed in the trench and adjacent to the lower portion of the element region; and
    a bit line electrically connected to the first diffusion layer.

2. The device according to claim 1, further comprising an element isolation insulating film having an upper surface positioned below the upper surface of the element region.

3. The device according to claim 2, wherein a height of the upper surface of the element isolation insulating film is equal to a height of the second bottom surface of the gate electrode.

4. The device according to claim 1, further comprising a groove formed in an upper portion of the trench, having a depth shallower than a depth of the trench, and having an opening larger than an opening of the trench.

5. The device according to claim 4, wherein a bottom surface of the groove is in contact with the second bottom surface of the gate electrode.

6. The device according to claim 1, further comprising:
    a groove formed in an upper portion of the trench, having a depth shallower than a depth of the trench, and having an opening larger than an opening of the trench; and
    an element isolating insulating film formed below the groove.

7. The device according to claim 6, wherein heights of a bottom surface of the groove and an upper surface of the element isolation insulating film are equal to a height of the second bottom surface of the gate electrode.

8. The device according to claim 6, wherein a bottom surface of the groove is in contact with the second bottom surface of the gate electrode.

9. The device according to claim 1, further comprising:
a connecting portion formed in the trench and connected to the capacitor; and
an interface layer formed on an inner side surface of the trench between the second diffusion layer and connecting portion.

10. The device according to claim 1, further comprising a pad formed between the upper surface of the element region and the first bottom surface of the gate electrode.

11. The device according to claim 1, wherein the capacitor comprises:
a lower electrode formed along an outer side surface and outer bottom surface of the trench, and made of a diffusion layer;
a capacitor insulating film formed on an inner side surface and inner bottom surface of the trench; and
an upper electrode formed on the capacitor insulating film in the trench, and electrically connected to the second diffusion layer.

12. The device according to claim 1, wherein the first diffusion layer comprises:
a low-concentration region; and
a high-concentration region formed contiguously with the low-concentration region.

13. The device according to claim 1, further comprising a silicide layer formed on the gate electrode.

* * * * *